(12) United States Patent
Geusic et al.

(10) Patent No.: US 7,550,824 B2
(45) Date of Patent: Jun. 23, 2009

(54) LOW K INTERCONNECT DIELECTRIC USING SURFACE TRANSFORMATION

(75) Inventors: Joseph E. Geusic, Berkeley Heights, NJ (US); Paul A. Farrar, So. Burlington, VT (US); Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 675 days.

(21) Appl. No.: 10/931,593

(22) Filed: Aug. 31, 2004

(65) Prior Publication Data

US 2005/0029501 A1  Feb. 10, 2005

Related U.S. Application Data

(62) Division of application No. 10/106,915, filed on Mar. 25, 2002, now Pat. No. 7,132,348.

(51) Int. Cl.
*H01L 23/58* (2006.01)
(52) U.S. Cl. .................. 257/642; 257/759; 257/760
(58) Field of Classification Search ................. None
See application file for complete search history.

(56) References Cited

U.S. PATENT DOCUMENTS

| | | | |
|---|---|---|---|
| 4,962,058 A | 10/1990 | Cronin et al. | 437/187 |
| 5,055,426 A | 10/1991 | Manning | 438/622 |
| 5,110,754 A | 5/1992 | Lowrey et al. | 437/52 |
| 5,250,459 A | 10/1993 | Lee | 437/52 |
| 5,404,029 A | 4/1995 | Husher et al. | 257/50 |
| 5,527,739 A | 6/1996 | Parrillo et al. | 438/627 |
| 5,599,745 A | 2/1997 | Reinberg | |
| 5,639,684 A | 6/1997 | Kwok | 438/600 |
| 5,798,559 A | 8/1998 | Bothra et al. | 257/522 |
| 5,811,870 A | 9/1998 | Bhattacharyya et al. | 257/530 |
| 5,834,824 A | 11/1998 | Shepherd et al. | 257/530 |
| 5,858,869 A | 1/1999 | Chen et al. | |
| 5,866,204 A | 2/1999 | Robbie et al. | 427/256 |
| 5,903,041 A | 5/1999 | La Fleur et al. | 257/530 |
| 5,953,625 A | 9/1999 | Bang | 438/619 |

(Continued)

OTHER PUBLICATIONS

Wolf et al., Silicon Processing for the VLSI Era, 2000, vol. I, Lattice Press, 791-795.*

(Continued)

*Primary Examiner*—Leonardo Andújar
(74) *Attorney, Agent, or Firm*—Schwegman, Lundberg & Woessner, P.A.

(57) ABSTRACT

Systems, devices and methods are provided to improve performance of integrated circuits by providing a low-k insulator. One aspect is an integrated circuit insulator structure. One embodiment includes a solid structure of an insulator material, and a precisely determined arrangement of at least one void formed within the solid structure which lowers an effective dielectric constant of the insulator structure. One aspect is a method of forming a low-k insulator structure. In one embodiment, an insulator material is deposited, and a predetermined arrangement of at least one hole is formed in a surface of the insulator material. The insulator material is annealed such that the low-k dielectric material undergoes a surface transformation to transform the arrangement of at least one hole into predetermined arrangement of at least one empty space below the surface of the insulator material. Other aspects are provided herein.

13 Claims, 12 Drawing Sheets

U.S. PATENT DOCUMENTS

| | | | |
|---|---|---|---|
| 5,962,910 A | 10/1999 | Hawley et al. | 257/530 |
| 5,969,983 A | 10/1999 | Thakur et al. | 365/419 |
| 5,973,380 A | 10/1999 | Cutter et al. | 257/530 |
| 5,994,776 A | 11/1999 | Fang et al. | 257/758 |
| 6,013,970 A * | 1/2000 | Nishiwaki et al. | 310/330 |
| 6,016,000 A * | 1/2000 | Moslehi | 257/522 |
| 6,016,001 A | 1/2000 | Sanchez et al. | 257/530 |
| 6,057,224 A | 5/2000 | Bothra et al. | 438/619 |
| 6,069,064 A | 5/2000 | Cutter et al. | 438/600 |
| 6,077,792 A | 6/2000 | Farrar | 438/780 |
| 6,084,814 A | 7/2000 | Casper et al. | 365/225.7 |
| 6,088,282 A | 7/2000 | Loughmiller et al. | 365/225.7 |
| 6,097,077 A | 8/2000 | Gordon et al. | 257/530 |
| 6,146,925 A | 11/2000 | Dennison | 438/131 |
| 6,202,065 B1 | 3/2001 | Wills | 707/5 |
| 6,206,065 B1 | 3/2001 | Robbie et al. | 156/349 |
| 6,248,422 B1 | 6/2001 | Robbie et al. | 428/119 |
| 6,252,293 B1 | 6/2001 | Seyyedy et al. | 257/530 |
| 6,255,156 B1 | 7/2001 | Forbes et al. | 438/235 |
| 6,277,728 B1 | 8/2001 | Ahn et al. | 438/619 |
| 6,284,675 B1 | 9/2001 | Jin et al. | 438/778 |
| 6,288,437 B1 | 9/2001 | Forbes et al. | 257/530 |
| 6,291,871 B1 | 9/2001 | Dennison | 257/530 |
| 6,323,536 B1 | 11/2001 | Cutter et al. | 257/530 |
| 6,344,373 B1 | 2/2002 | Bhattacharyya et al. | 438/131 |
| 6,351,425 B1 | 2/2002 | Porter | 365/225.7 |
| 6,383,924 B1 | 5/2002 | Farrar et al. | 438/667 |
| 6,387,824 B1 * | 5/2002 | Aoi | 438/778 |
| 6,423,582 B1 | 7/2002 | Fischer et al. | 438/132 |
| 6,444,558 B1 | 9/2002 | Cutter et al. | 438/600 |
| 6,456,149 B2 | 9/2002 | Cutter et al. | 327/525 |
| 6,458,630 B1 | 10/2002 | Daubenspeck et al. | 438/131 |
| 6,495,395 B2 | 12/2002 | Reinberg | 438/107 |
| 6,498,056 B1 | 12/2002 | Motsiff et al. | 438/131 |
| 6,509,623 B2 | 1/2003 | Zhao | 257/522 |
| 6,525,399 B2 | 2/2003 | Cutter et al. | 257/530 |
| 6,541,811 B2 | 4/2003 | Thakur et al. | 257/303 |
| 6,582,512 B2 | 6/2003 | Geusic et al. | 117/3 |
| 6,589,334 B2 | 7/2003 | John et al. | 117/84 |
| 6,630,724 B1 | 10/2003 | Marr | 257/530 |
| 6,657,277 B1 | 12/2003 | Hsieh | 257/530 |
| 6,674,667 B2 | 1/2004 | Forbes | 365/185.24 |
| 6,943,065 B2 | 9/2005 | Bhattacharyya et al. | |
| 7,109,563 B2 | 9/2006 | Ahn et al. | |
| 7,132,348 B2 | 11/2006 | Geusic et al. | |
| 2002/0182837 A1 | 12/2002 | Daubenspeck et al. | 438/601 |
| 2003/0042534 A1 | 3/2003 | Bhattacharyya | 257/317 |
| 2003/0071324 A1 | 4/2003 | Motsiff et al. | 257/530 |
| 2003/0075438 A1 | 4/2003 | Dalmia et al. | 204/400 |
| 2003/0181018 A1 | 9/2003 | Geusic et al. | 438/422 |
| 2004/0266220 A1 | 12/2004 | Ahn et al. | |
| 2005/0023638 A1 | 2/2005 | Bhattacharyya et al. | |
| 2006/0208335 A1 | 9/2006 | Ahn et al. | |

OTHER PUBLICATIONS

"CRC handbook of chemistry and physics", *49th edition, CRC Press*, Cleveland, Ohio, (1968-1969),E-61.

Abelmann, L , et al., "Oblique evaporation and surface diffusion", *Thin Solid Films*, 305(1-2), (Aug. 15, 1997),1-21.

Asoh, H , "Fabrication of ideally ordered anodic porous alumina with 63 nm hole periodicity using sulfuric acid", *Journal of Vacuum Science & Technology B (Microelectronics and Nanometer Structures)*, 19(2), (Mar. 2001),569-72.

Beauvais, J. et al., "Nano-Imprint Lithography using Masks Fabricated by SiDWEL Process", *Tenth Canadian Semiconductor Technology Conference* Ottawa, Canada, (August 13-17, 2001).

Bhattacharyya, A. , "Physical & Electrical Characteristics of LPCVD Silicon Rich Nitride", *ECS Technical Digest, J. Electrochem. Soc.*, 131(11), 691 RDP, New Orleans,(1984),469C.

Chou, S Y., et al., "Imprint lithography with sub-10 nm feature size and high throughput", *Microelectronic Engineering*, 35(1-4), (Feb. 1997),237-40.

Chou, S Y., et al., "Sub-10 nm imprint lithography and applications", *Journal of Vacuum Science & Technology B (Microelectronics and Nanometer Structures)*, 15(6), (Nov.-Dec. 1997),2897-904.

Colgan, M J., et al., "Field emission from carbon and silicon films with pillar microstructure", *Thin Solid Films*, 389(1-2), (Jun. 15, 2001),1-4.

Das, B , et al., "Template Based Semiconductor Nanostructure Fabrication and their Applications", *Invited Paper, 11th International Workshop in the Physics of Semiconductor Devices*, (2001),D.1.1.

Devasahayam, A J., et al., "Material Properties of Ion Beam Deposited Oxides for the Opto-Electronic Industry", *Tenth Canadian Semiconductor Technology Conference*, Ottawa, Canada, (Aug. 13-17, 2001).

Jeng, Shin-Puu , et al., "A planarized multilevel interconnect scheme with embedded low-dielectric-constant polymers for sub-quarter-micron applications", *VLSI Technology, 1994. Digest of Technical Papers. 1994 Symposium on* , Jun. 7-9, 1994,73-74.

Jin, C , "Evaluation of ultra-low-k dielectric materials for advanced interconnects", *Journal of Electronic Materials*, 30(4), (Apr. 2001),284-9.

Jurczak, M , "SON (silicon on nothing)-a new device architecture for the ULSI era", *VLSI Technology, 1999. Digest of Technical Papers . 1999 Symposium on* Jun. 14-16, 1999, (Jun. 1999),29-30.

Karunasiri, R.P. U., et al., "Thin-film growth and the shadow instability", *Physical Review Letters*, 62(7), (Feb. 13, 1989),788-91.

Kingery, W D., "Introduction to ceramics", New York, Wiley, (1963),262-263.

Kittel, C A., "Introduction to Solid State Physics", *3rd Edition*, J. Wiley & Sons (1967),25.

Malac, Marak , et al., "Thin Films Deposited at Glancing Incidence and their Applications", *Vacuum Technology & Coating*, (Jul. 2001),48-53.

Messier, R , et al., "Engineered sculptured nematic thin films [solid microstructures]", *Journal of Vacuum Science & Technology A (Vacuum, Surfaces, and Films)*, 15(4), (Jul.-Aug. 1997),2148-52.

Mizushima, I. , "Empty-space-in-silicon technique for fabricating a silicon-on-nothing structure", *Applied Physics Letters*, 77(20), American Institute of Physics, NY,(Nov. 13, 2000),3290-3292.

Morey, George W., "The properties of glass", Published New York, Reinhold publishing corporation, Series Monograph series (American Chemical Society) ; No. 77., (1938),12, 48-49.

Nichols, F A., "Surface-(inteface) and volume-diffusion contributions to morphological changes driven by capillarity", *Transactions of the American Institute of Mining, Metallurgical and Petroleum Engineers*, 233(10), (1965),1840-8.

Pandya, D K., "Obliquely deposited amorphous Ge films. I. Growth and structure", *Journal of Applied Physics*, 46(7), (Jul. 1975),2966-75.

Robbie, K , et al., "Sculptured thin films and glancing angle deposition: growth mechanics and applications", *Journal of Vacuum Science & Technology A (Vacuum, Surfaces, and Films)*, v 15, n 3, pt.2, (May-Jun. 1997),1460-5.

Sato, T , "A new substrate engineering for the formation of empty space in silicon (ESS) induced by silicon surface migration", *International Electron Devices Meeting 1999. Technical Digest*, (1999),517-20.

Sato, T , "Trench transformation technology using hydrogen annealing for realizing highly reliable device structure with thin dielectric films", *1998 Symposium on VLSI Technology Digest of Technical Papers*, (1998),206-7.

Tait, R N., et al., "Modelling and characterization of columnar growth in evaporated films", *Thin Solid Films*, 226(2), (Apr. 30, 1993),196-201.

Thornton, T A., "High rate thick film growth", *Annual review of materials science*, vol. 7, (1997),239-60.

Treichel, H., "Low dielectric constant materials", *Journal of Electronic Materials*, 30(4), (Apr. 2001),290-8.

Wojcik, J, et al., "Characterization of Silicon Oxynitride Thin Films Deposited by ECR-PECVD", *Tenth Canadian Semiconductor Technology Conference*, Ottawa, Canada, (Aug. 13-17, 2001).

Zhang, F, "Nanoglass/sup TM/ E copper damascene processing for etch, clean, and CMP", *Proceedings of the IEEE 2001 International Interconnect Technology Conference*, (2001),57-9.

* cited by examiner

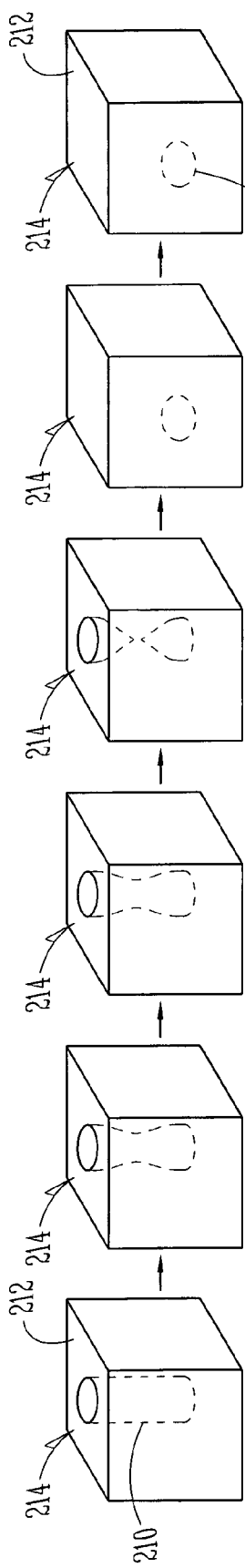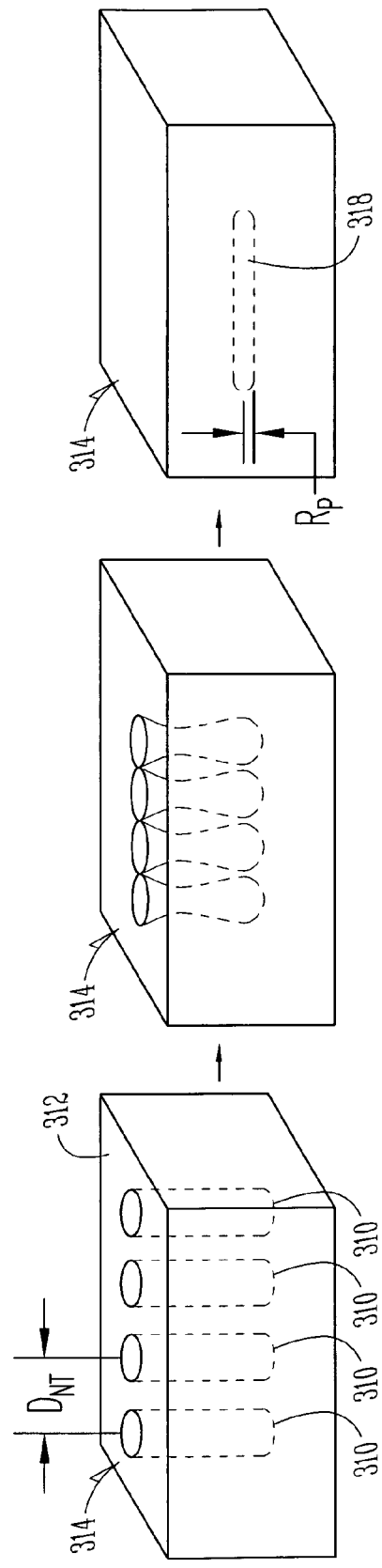

THE BINARY SYSTEM $K_2O-Al_2O_3-4SiO_2$ (LEUCITE)-$SiO_2$

LOW K INTERCONNECT DIELECTRIC USING SURFACE TRANSFORMATION

CROSS REFERENCE TO RELATED APPLICATIONS

This application is a divisional of U.S. application Ser. No. 10/106,915 filed Mar. 25, 2002, now U.S. Pat. No. 7,132,348 which application is incorporated herein by reference.

This application is also related to the following co-pending, commonly assigned U.S. patent applications which are herein incorporated by reference in their entirety: "Method of Forming Buried Conductor Patterns By Surface Transformation of Empty Spaces in Solid State Materials," Ser. No. 09/734,547, filed on Dec. 13, 2000; "Method of Forming Mirrors By Surface Transformation of Empty Spaces in Solid State Materials," Ser. No. 09/855,532, filed on May 16, 2001; "Method of Forming Three-Dimensional Photonic Band Structures in Solid Materials," Ser. No. 09/861,770, filed on May 22, 2001; and "Scalable High Performance Antifuse Structure and Process," Ser. No. 10/106,916, filed on Mar. 25, 2002; and "Films Deposited At Glancing Incidence For Multilevel Metallization," Ser. No. 10/105,672, filed on Mar. 25, 2002.

TECHNICAL FIELD OF THE INVENTION

This invention relates generally to integrated circuits and, more particularly, to integrated circuit dielectrics useful for reducing the signal delay time attributable to interconnects.

BACKGROUND OF THE INVENTION

The semiconductor industry continuously strives to reduce the size and cost of integrated circuits. One method for measuring the performance of an integrated circuit uses the maximum clock speed at which the circuit operates reliably, which depends on how fast transistors can be switched and how fast signals can propagate.

One particular problem confronting the semiconductor industry is that, as integrated circuit scaling continues, the performance improvement is limited by the signal delay time attributable to interconnects in the integrated circuit. According to one definition, integrated circuit interconnects are three-dimensional metal lines with submicrometer cross sections surrounded by insulating material. One definition of an interconnect delay is the product of the interconnect resistance (R) and the parasitic capacitance (C) for the interconnect metal to the adjacent layers. Because of the progressive scaling, the parasitic capacitance (C) has significantly increased due to closer routing of wires, and the interconnect resistance (R) has significantly increased due to a continuous reduction of the wire section.

The following approximations for various generations of integrated circuit technology illustrates this problem. For example, the delay in 0.7 µm technology is about 500 ps, in which about 200 ps seconds are attributable to gate delays and about 300 ps are attributable to interconnect delays. The delay in 0.18 µm technology is about 230 ps, in which about 30 ps are attributable to gate delays and about 200 ps are attributable to interconnect delays. As integrated circuit scaling continues, it is desirable to lower the interconnect RC time constant by using metals with a high conductivity. One high conductivity metal used to lower the RC constant is copper. The use of copper in 0.18 µm technology improves the interconnect delays to about 170 ps. However, even though the delay attributable to the gates continues to decrease as scaling continues beyond the 0.18 µm technology, the overall delay increases significantly because the interconnect delay is significantly increased. It has been estimated that as much as 90 percent of the signal delay time in future integrated circuit designs may be attributable to the interconnects and only 10 percent of the signal delay may be attributable to transistor device delays. As such, it is desirable to lower the interconnect RC time constant by using materials with a low dielectric constant (k).

Low-k dense materials are available having a k in a range between 2.5 and 4.1. The fluorination of dielectric candidates, such as Teflon®, achieve a k of about 1.9.

Air has a k of about 1. One direction for developing low-k dielectrics incorporates air into dense materials to make them porous. The dielectric constant of the resulting porous material is a combination of the dielectric constant of air ($k \approx 1$) and the dielectric constant of the dense material. As such, it is possible to lower the dielectric constant of a low-k dense material by making the dense material porous.

FIG. 1 illustrates a known Xerogel process for forming porous, silica-based material with a lower dielectric constant (k). Xerogels and Aerogels based on silica incorporate a large amount of air in voids, such that dielectric constants of 1.95 and lower have been achieved with voids that are as small as 5-10 nm. However, it is difficult to control the preparation of Xerogel and Aerogel low-k films. Furthermore, large amounts of liquid solvents and non-solvents have to be removed to form the voids, which tend to produce variability in the void size, shape and density, and tend to produce shrinkage that can cause high internal stress and cracking.

Therefore, there is a need in the art to provide a system and method that improves integrated circuit performance by reducing the interconnect RC time constant. There is a need in the art to provide a low-k dielectric insulator for the interconnects that is easily prepared, that is consistently formed and that does not suffer from high internal stress and cracking.

SUMMARY OF THE INVENTION

The above mentioned problems are addressed by the present subject matter and will be understood by reading and studying the following specification. The present subject matter provides a low-k dielectric insulator for integrated circuit interconnects that is easily prepared, that is consistently formed and that does not suffer from high internal stress and cracking. The low-k dielectric insulator of the present invention includes empty spaces formed using surface transformation. As such, the present invention provides a system and method that improves integrated circuit performance by reducing the interconnect RC time constant.

One aspect of the present subject matter is an integrated circuit insulator structure. One embodiment of the structure includes a solid structure of an insulator material, and a precisely determined arrangement of at least one void formed within the solid structure. The precisely-determined arrangement of at least one void within the solid structure lowers an effective dielectric constant of the insulator structure. According to one embodiment of the structure, the precisely determined arrangement of at least one void is formed within the solid structure by surface transformation. According to various embodiments, the at least one void includes spherical, pipe-shaped and plate-shaped voids.

One aspect of the present subject matter is a method of forming a low-k insulator structure. In one embodiment, an insulator material is deposited, and a predetermined arrangement of at least one hole is formed in a surface of the insulator material. In one embodiment, the at least one hole includes a cylindrical hole. The insulator material is annealed such that the low-k dielectric material undergoes a surface transformation to transform the arrangement of at least one hole into predetermined arrangement of at least one empty space below the surface of the insulator material. According to various embodiments, the predetermined arrangement of at least one hole is formed as one or more spheres, one or more plate-shaped voids, and/or one or more pipe-shaped voids.

One aspect of the present subject matter is a method of forming an integrated circuit. In one embodiment, an inter-layer insulator is formed and a metal level is formed on the inter-layer insulator. The interlayer insulator is formed by depositing a low-k, relatively low melting dielectric material. A predetermined arrangement of holes is formed in a surface of the low-k dielectric material. The low-k dielectric material is annealed such that the low-k dielectric material undergoes a surface transformation to transform the arrangement of at least one hole into a predetermined arrangement of at least one empty space below the surface of the low-k dielectric material. According to various embodiments, the holes are formed and the material is annealed either before or after the metal level is formed on the inter-layer insulator.

These and other aspects, embodiments, advantages, and features will become apparent from the following description of the invention and the referenced drawings.

BRIEF DESCRIPTION OF THE DRAWINGS

FIGS. 2A-2F illustrate a portion of a silicon substrate undertaking a sequence of steps for single sphere-shaped empty space formation.

FIGS. 3A-3C illustrate a portion of a silicon substrate undertaking a sequence of steps for single pipe-shaped empty space formation.

DETAILED DESCRIPTION OF THE INVENTION

Figure 1:
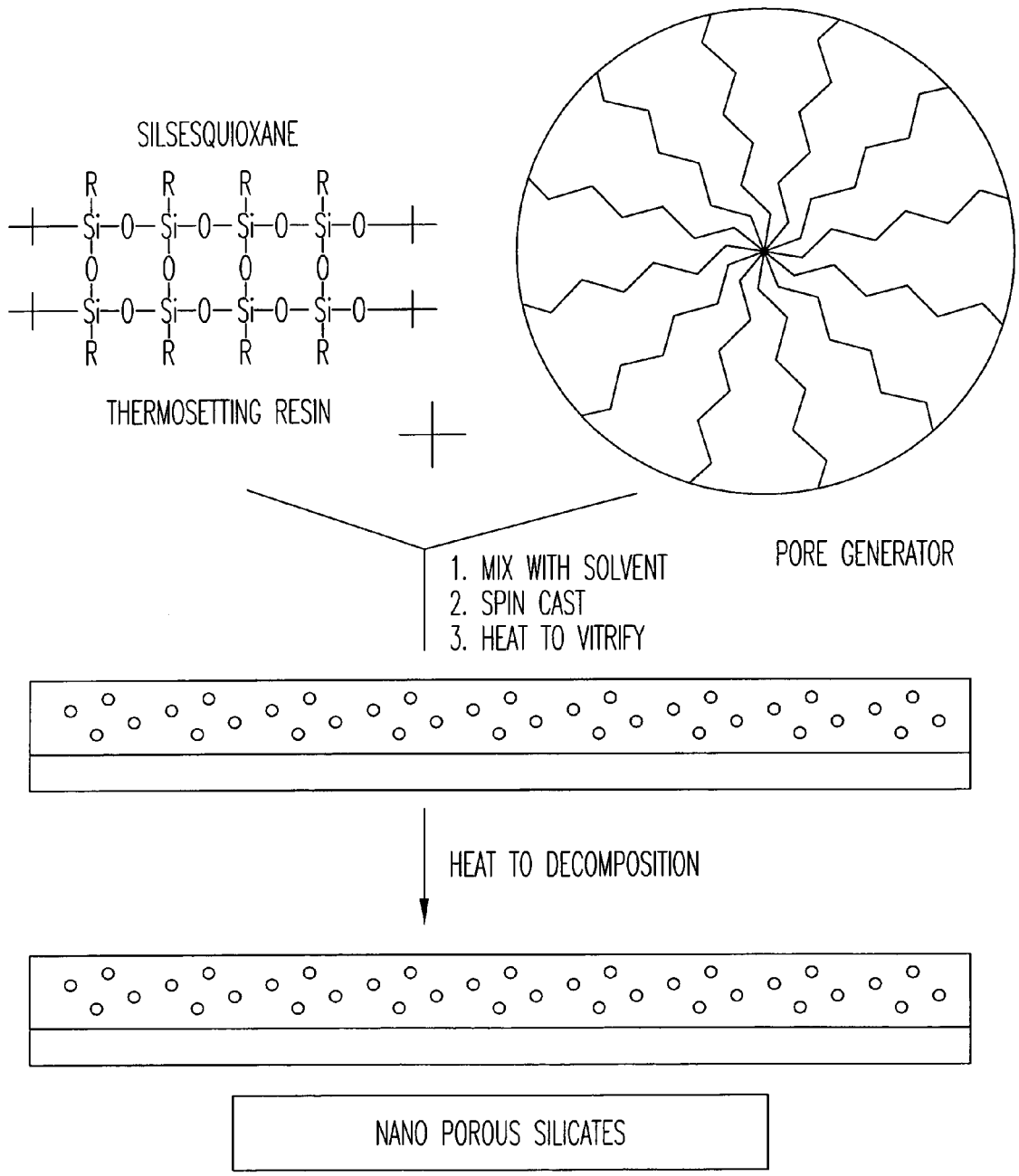
FIG. 1 illustrates a known Xerogel process for forming porous, silica-based material with a lower dielectric constant (k).

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The present subject matter improves integrated circuit performance by reducing the RC time delays attributable to interconnects. The present subject matter provides a low-k dielectric insulator of greater uniformity and dimensional stability for advanced integrated circuits. The low-k dielectric insulator of the present invention includes empty spaces, which reduces the effective dielectric constant ($k_{eff}$) of the insulator, that are controllably formed using surface transformation.

As analyzed by Nichols et al. (F. A. Nichols et al., Trans. AIME 233, (10), p 1840, 1965) when a solid is heated to a higher temperature, a solid with a cylindrical hole that is beyond a critical length ($\lambda_c$) becomes unstable. The cylindrical hole is transformed into one or more empty spheres formed along the cylinder axis. The number (N) of spheres formed depends on the length (L) and radius ($R_C$) of the cylinder. Two models of diffusion are surface diffusion and pure volume diffusion. With respect to surface diffusion, for example, the relation between the cylinder length (L), cylinder radius ($R_C$), and number of spheres (N) is expressed by the following equation:

$$8.89 \times R_C \times N \leq L < 8.89 \times R_R \times (N+1). \tag{1}$$

Equation (1) predicts that no empty spheres will form if $L < 8.89 \times R_C$. Each empty sphere that forms has a radius ($R_S$) expressed by the following equation:

$$R_S = 1.88 \times R_C. \tag{2}$$

If the cylinder has sufficient length L to form two spheres, the center-to-center spacing between the spheres corresponds to the critical length ($\lambda_C$) and is provided by the equation:

$$\lambda_C = 8.89 \times R_C. \tag{3}$$

Pure volume diffusion provides similar results, with slightly different constants. For example, depending on the exact magnitude of the diffusion parameters, $\lambda_C$ can vary from 9.02×$R_R$ to 12.96×$R_R$. One of ordinary skill in the art will understand that the diffusion model is capable of being determined by experiment. The remainder of this disclosure assumes surface diffusion. One of ordinary skill in the art will understand, upon reading and comprehending this disclosure, how to apply the teachings of the present invention to another diffusion model.

As analyzed by Sato et al. (T. Sato et al., VLSI Dig., p206, 1998), a deep trench in silicon, which has a melting temperature of 1400° C., is transformed into empty spheres along the axis of the original trench at a reducing ambient of 10 Torr of hydrogen and an annealing temperature of 1100° C. The empty spheres are uniformly sized and spaced.

As analyzed by Sato et al. (T. Sato et al., 1999 IEDM Digest, paper 20.6.1), various shaped empty spaces such as spheres, pipes, and plates are capable of being formed under the surface of a silicon substrate. The shape of the empty spaces formed during the annealing conditions depends on the size, number and spacing of the cylindrical holes that are initially formed at a lower temperature.

FIGS. 2A-2F illustrate a portion of a silicon substrate undertaking a sequence of steps for single sphere-shaped empty space formation. A cylindrical hole 210 is formed in the surface 212 of a volume of a solid material 214. As used here, the term hole refers to a void defined by the solid material. The material 214 is heated (annealed) and undergoes the transformation illustrated in FIGS. 2B through 2F. The result of the surface transformation process is an empty sphere 216 formed below the surface 212 of the volume of material 214.

In order to form a single sphere, which holds true for forming a single pipe or plate, the length (L) and radius ($R_C$) of the cylindrical holes are chosen such that equation (1) with N=1 is satisfied. It is pointed out that a vertical stacking of N empty spaces results if the length of the cylindrical holes is such that equation (1) is satisfied.

In order for single surface-transformed spheres to combine with other surface-transformed spheres, the center-to-center spacing ($D_{NT}$) between the initial cylindrical holes will satisfy the following equation:

$$2 \times R_C < D_{NT} < 3.76 \times R_C. \quad (4)$$

Satisfying this equation prevents the adjacent initial cylindrical holes from touching, yet allows the adjacent surface-transformed spheres to combine and form pipe and plate empty spaces, as shown in FIGS. 3A-3C and FIGS. 4A-4B and described below.

FIGS. 3A-3C illustrate a portion of a silicon substrate undertaking a sequence of steps for single pipe-shaped empty space formation. A linear array of cylindrical holes 310 is formed in a surface 312 of a solid material 314. The cylindrical holes 310 have a center-to-center spacing ($D_{NT}$) as calculated using equation (4). The material 314 is heated (annealed) and undergoes the transformation illustrated in FIGS. 3B through 3C. The result of the surface transformation process is an empty pipe-shaped void 318 formed below the surface 312 of the volume of material 314. The radius ($R_P$) of the pipe 318 is provided by the following equation:

$$R_P = \sqrt{\frac{8.86 \times R_C^3}{D_{NT}}}. \quad (5)$$

Figures 4A, 4B:
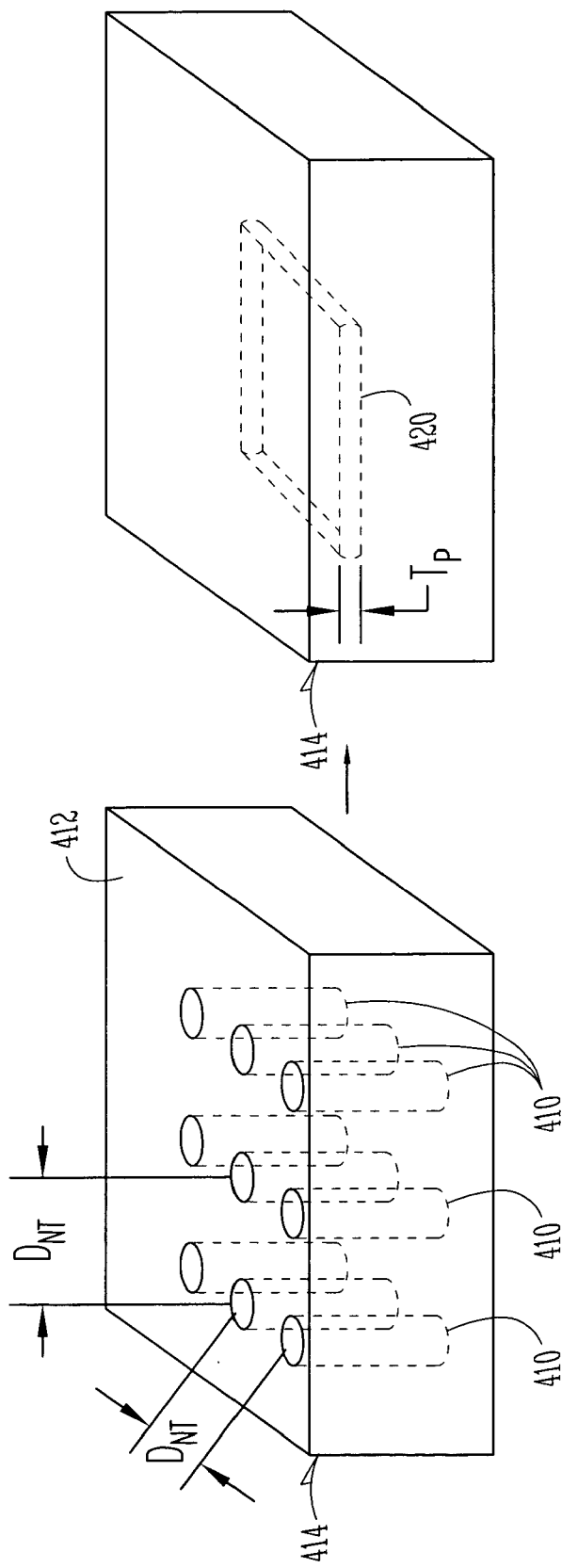
FIGS. 4A-4B illustrate a portion of a silicon substrate undertaking a sequence of steps for plate-shaped empty space formation.

FIGS. 4A-4B illustrate a portion of a silicon substrate undertaking a sequence of steps for plate-shaped empty space formation. A two-dimensional array of cylindrical holes 410 is formed in a surface 412 of a solid material 414. The cylindrical holes 410 have a center-to-center spacing ($D_{NT}$) as calculated using equation (4). The material 414 is heated (annealed) and undergoes the transformation illustrated in FIGS. 4B. The result of the surface transformation process is an empty plate-shaped void 420 formed below the surface 412 of the volume of material 414. The thickness ($T_P$) of a plate 420 is given by the following equation:

$$T_P = \frac{27.83 \times R_C^3}{D_{NT}^2} \quad (6)$$

The present subject matter forms low-k materials using surface transformation. That is, the present subject matter incorporates surface transformation formed empty spaces to lower the effective dielectric ($k_{eff}$) of an insulator. The size, shape and spacing of empty spaces is controlled by the diameter, depth and spacing of cylindrical holes initially formed in a solid dielectric material that has a defined melting temperature. Empty spaces or voids are formed after annealing below the defined melting temperature. The empty spaces or voids are capable of being formed with a spherical, pipe, or plate shape, or combinations of these shapes.

The surface transformed empty spaces do not provide additional stress or produce a tendency to crack because the volume of air incorporated in the surface transformed empty spaces is equal to the volume of air within the initial starting pattern of cylindrical holes. It is noted that if the cylinder length (L) is equal to an integer of a critical length ($\lambda_c$) such as 1×$\lambda_c$ to form one sphere, 2×$\lambda_c$ to form two spheres, 3×$\lambda_c$ to form three spheres, etc., then the surface will be smooth after the surface transformed empty spaces are formed. However, if the cylinder length (L) is not equal to an integer of a critical length ($\lambda_c$), then the surface will have dimples caused by air in the cylinder attributable to the length beyond an integer of a critical length ($\lambda_c$). That is, for a given length L and $\lambda_c$, the number of spheres formed is the integer of L/$\lambda_c$, and the remainder of L/$\lambda_c$ contributes to the dimples on the surface.

Figure 5:
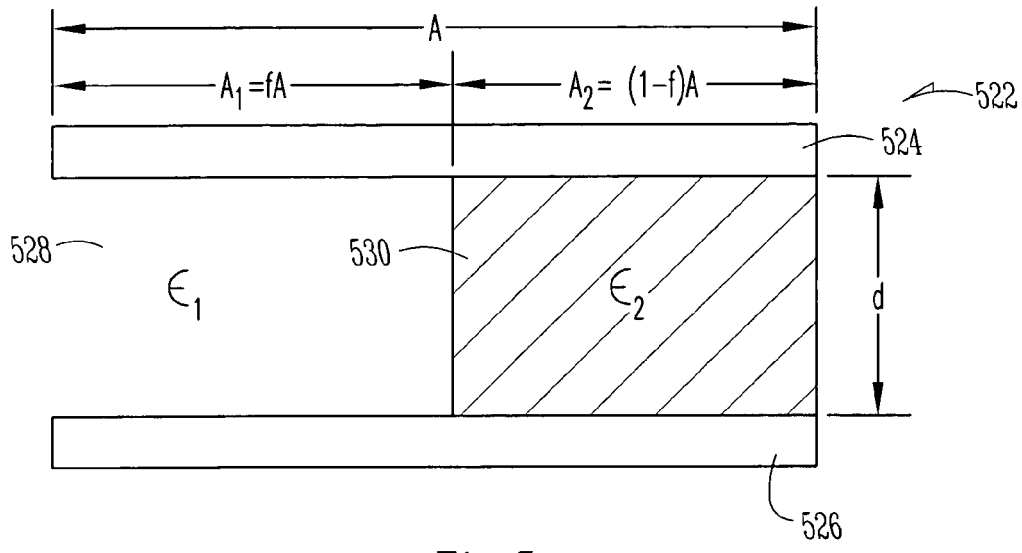
FIG. 5 illustrates a parallel capacitor model for two distinct dielectrics in parallel with each other, the first dielectric having a permittivity of $\epsilon_1$, or a permittivity of free space ($\epsilon_0$), and the second dielectric having a permittivity of $\epsilon_2$.

FIG. 5 illustrates a parallel capacitor model for two distinct dielectrics in parallel with each other, the first dielectric having a permittivity of $\in_1$, or a permittivity of free space ($\in_0$), and the second dielectric having a permittivity of $\in_2$. The capacitor 522 has a first electrode 524 and a second electrode 526. The first electrode 524 and the second electrode 526 both have a length (A) and are separated by a distance (d). A first dielectric 528 is formed between the first and second electrodes, and a second dielectric 530 is formed between the first and second electrodes and parallel to the first dielectric. The first dielectric extends a distance $A_1$, which is a fraction of the length A, from one end of the electrodes as provided by the following equation:

$$A_1 = f \times A. \quad (7)$$

The variable f represents the fraction (or filling factor) of the first dielectric 528, which is air (k≈1) in one embodiment. The second dielectric 530 extends a distance $A_2$, which is a fraction of the length A, from the opposing end of the electrodes as provided by the following equation:

$$A_2 = A - A_1 = (1-f) \times A. \quad (8)$$

The effective dielectric constant ($k_{eff(P)}$) for the parallel capacitor model is represented by the following equation:

$$k_{eff(P)} = f + k_2 \times (1-f). \quad (9)$$

Figure 6:
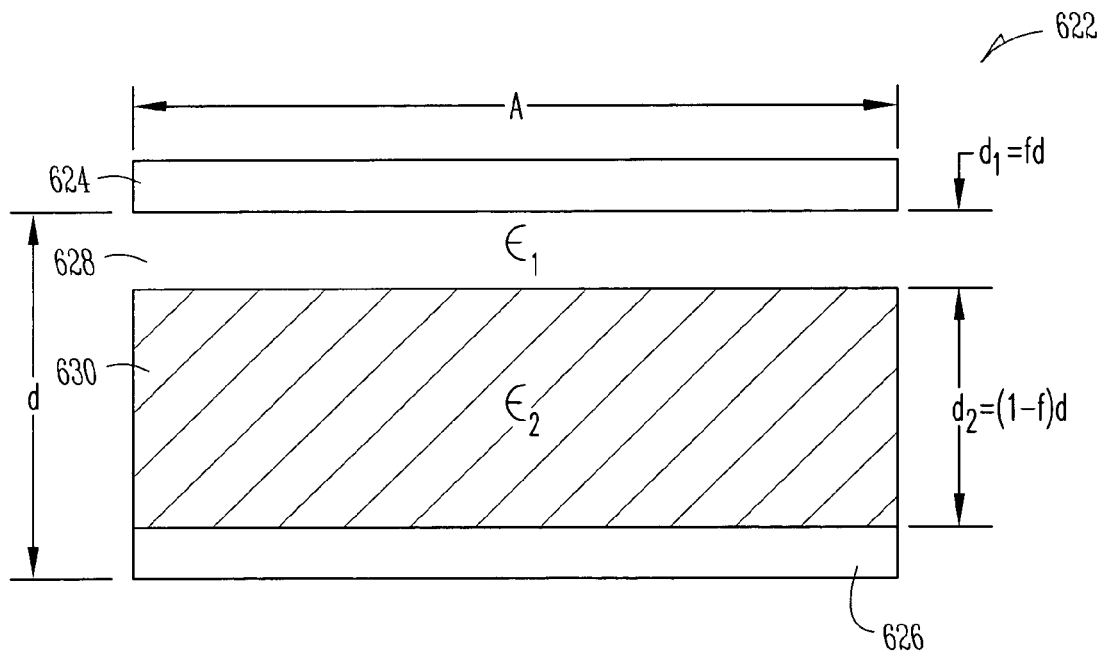
FIG. 6 illustrates a series capacitor model for two distinct dielectrics in series with each other, the first dielectric having a permittivity of $\epsilon_1$, or a permittivity of free space ($\epsilon_0$), and the second dielectric having a permittivity of $\epsilon_2$.

FIG. 6 illustrates a series capacitor model for two distinct dielectrics in series with each other, the first dielectric having a permittivity of $\in_1$, or a permittivity of free space ($\in_0$), and the second dielectric having a permittivity of $\in_2$. The capacitor 622 has a first electrode 624 and a second electrode 626. The first electrode 624 and the second electrode 626 both have a length (A) and are separated by a distance (d). A first dielectric 628 is formed in series with a second dielectric 630 between the first and second electrodes. The first dielectric 628 has a width $d_1$, which is a fraction of the distance d as represented by the following equation:

$$d_1 = f \times d. \tag{10}$$

The variable f represents the fraction (or filling factor) of the first dielectric 628, which is air (k≈1) in one embodiment. The second dielectric has a width $d_2$, which is fraction of the distance d as represented by the following equation:

$$d_2 = d - d_1 = (1-f) \times d. \tag{11}$$

The effective dielectric constant ($k_{eff(S)}$) for the series capacitor model is represented by the following equation:

$$k_{eff(S)} = \frac{1}{f + (1-f) \times \frac{1}{k_2}}. \tag{12}$$

Figure 7:
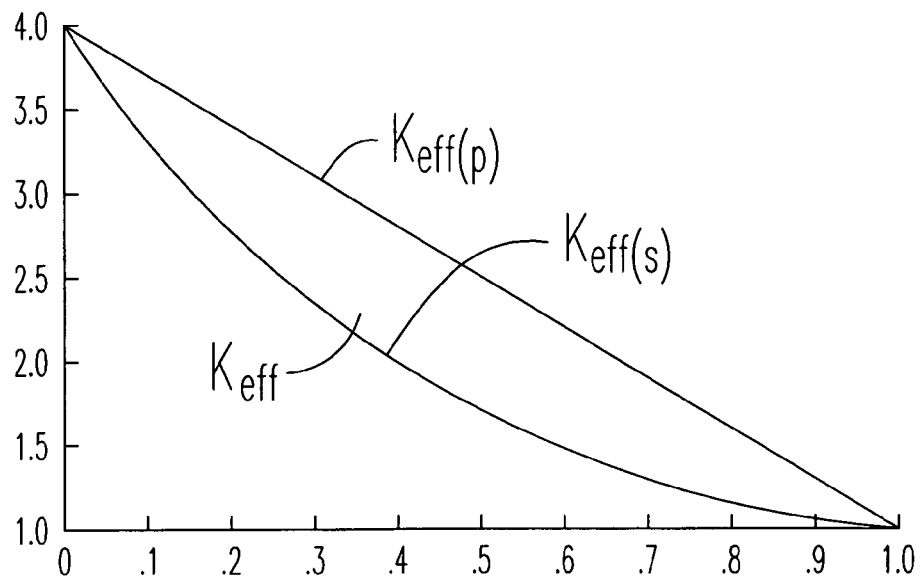
FIG. 7 illustrates plots of $k_{eff(P)}$ and $k_{eff(S)}$ which are plotted as a function of the filling factor "f", which is shown in FIGS. 5 and 6, and for $k_2$ equal to 4.0.

FIG. 7 illustrates plots of $k_{eff(P)}$ and $k_{eff(S)}$ which are each plotted as a function of the filling factor variable "f" and for $k_2$ equal to 4.0. One of ordinary skill in the art will recognize that similar plots can be made for other dielectric constant values. The effective dielectric constant ($k_{eff}$) of a material of dielectric constant $k_2$ with embedded empty spaces depends on the detailed size, shape orientation and spacing of the empty spaces relative to a set of parallel electrodes. However, the $k_{eff}$ for the material with a dielectric constant $k_2$ with embedded empty spaces is bounded between the effective capacitance for the parallel capacitor model ($k_{eff(P)}$) and the effective capacitance of the series capacitor model ($k_{eff(S)}$).

Figure 8:
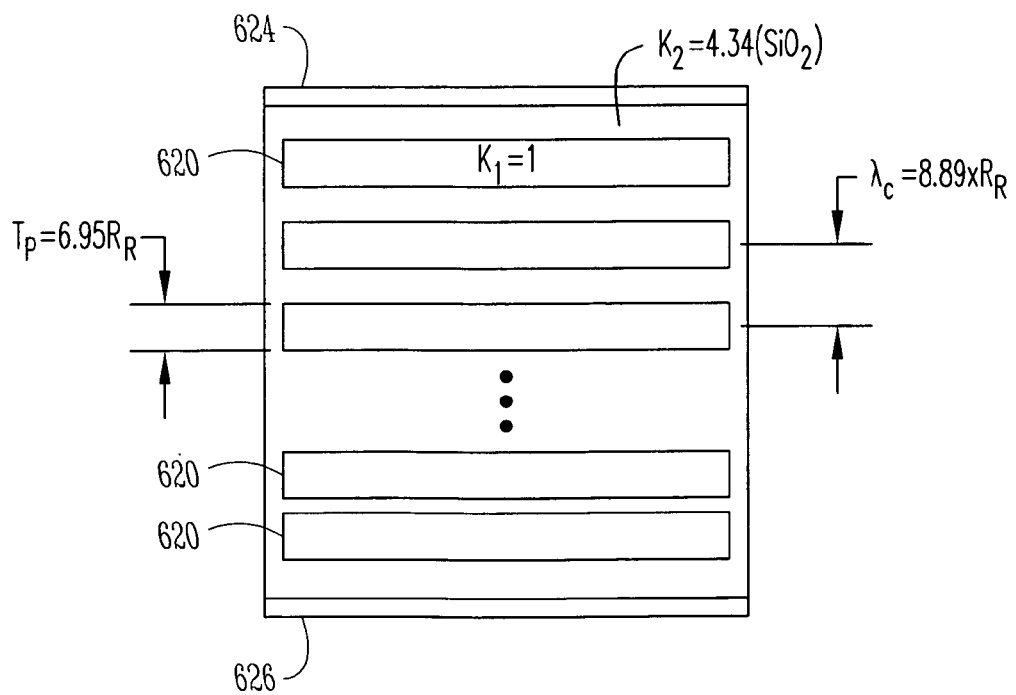
FIG. 8 illustrates a transformation formed stack of empty plates with a filling factor "f" approximately equal to 0.78 and an effective dielectric constant $k_{eff}$ approximately equal to 1.2.

FIG. 8 illustrates a transformation formed stack of empty plates with a filling factor "f" approximately equal to 0.78 and an effective dielectric constant $k_{eff}$ approximately equal to 1.2. This figure illustrates one example of the effective dielectric constant ($k_{eff}$) for a dielectric film of $SiO_2$, which has a dielectric constant (k) of 4.34 and a melting temperature of 1610° C., that incorporates surface transformation formed empty spaces. In the illustrated example, the surface transformation produces a vertical stack of empty plates 620 in the dielectric film between the electrodes 624 and 626. The number of empty plates formed depends on the length of the cylindrical holes.

From equation (6), it is determined that the thickness $T_P$ of the empty plate has a maximum value of $6.95 \times R_C$ when $D_{NT}$ is near the minimum allowed value of $2 \times R_C$ as inferred from equation (4). From equation (3), the center-to-center spacing (λ) of empty plates is $8.89 \times R_C$. It can be calculated that f≈0.78. The expression of $k_{eff}(s)$ applies and results in $k_{eff}$=1.2 for $k_2$=4.34 and f=0.78.

Figure 9:
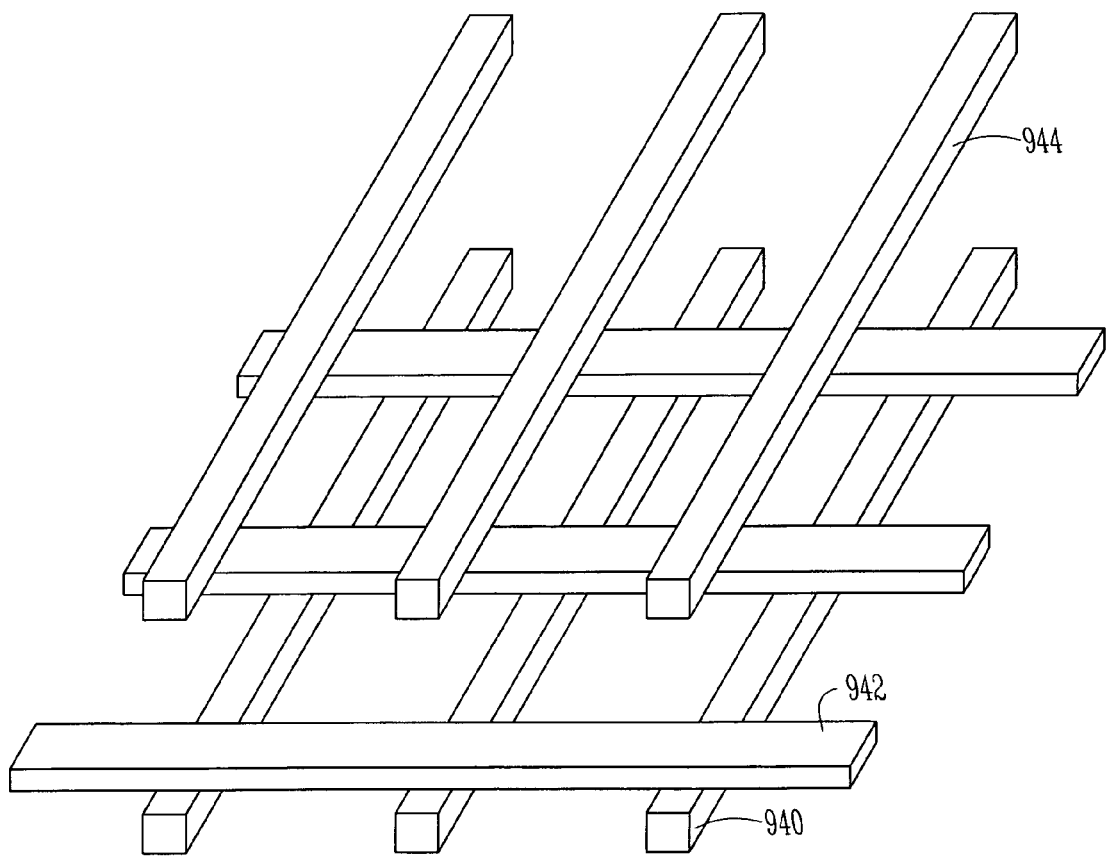
FIG. 9 illustrates metal levels for an integrated circuit.

FIG. 9 illustrates metal levels for an integrated circuit. The figure illustrates a first metal level 940, a second metal level 942, and a third metal level 944. The metal levels lie in approximately parallel planes. Individual lines within the metal levels typically run either parallel to or orthogonally to individual lines in other metal levels. The metal levels are separated by inter-layer dielectrics (not shown). The metal levels form boundaries for dielectric regions, or volumes, between the individual lines and the metal levels. For simplicity, the dielectric volumes are illustrated as a rectilinear volume in FIGS. 10 through 12. A goal is to maximize the amount of air that is incorporated into these dielectric volumes using surface transformation formed empty spaces.

Figure 10:
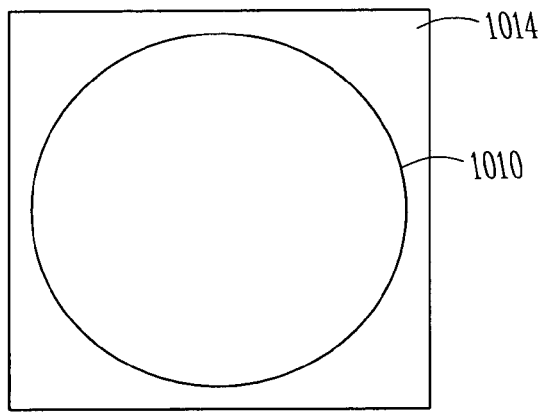
FIG. 10 illustrates a dielectric volume, such as that bounded by the metal levels shown in FIG. 9, with a single empty sphere formed therein.

FIG. 10 illustrates a dielectric volume 1014, such as that bounded by the metal levels shown in FIG. 9, with a single empty sphere 1010 formed therein. The dielectric volume often will have various shapes and sizes. As such, smaller spheres are used to obtain a larger filling factor when the empty spheres are packed or arranged with other spheres.

Figure 11:
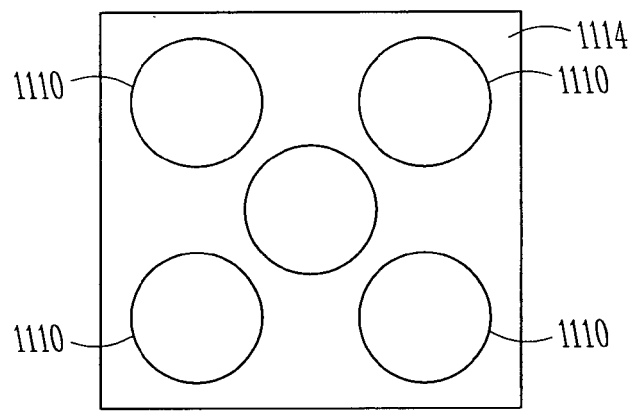
FIG. 11 illustrates a dielectric volume, such as that bounded by the metal levels shown in FIG. 9, with a close-pack structure of spheres formed therein.

FIG. 11 illustrates a dielectric volume 1114, such as that bounded by the metal levels shown in FIG. 9, with a close-pack structure of spheres 1110 formed therein. The spheres 1110 illustrated in FIG. 11 are smaller than the spheres 1010 illustrated in FIG. 10, and as such are capable of being packed into a variety of dielectric volumes.

Figure 12:
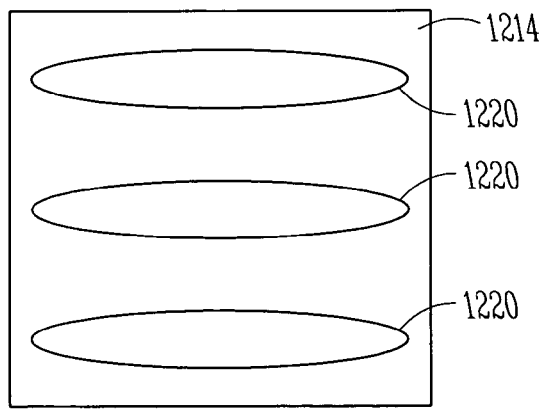
FIG. 12 illustrates a dielectric volume, such as that bounded by the metal levels shown in FIG. 9, with a stack of empty plates formed therein.

FIG. 12 illustrates a dielectric volume 1214, such as that bounded by the metal levels shown in FIG. 9, with a stack of empty plates 1220 formed therein. This figure illustrates that other shapes of surface transformation formed empty spaces are capable of being used to lower the effective dielectric constant ($k_{eff}$) of the dielectric volume. One of ordinary skill in the art will appreciate that various shapes and sizes of voids are capable of being used to pack various shapes and sizes of dielectric volumes.

In the example above, $SiO_2$ (quartz), which has a melting point of 1610° C., is used as the bulk dielectric material. For process compatibility reasons it may be desirable or necessary to employ other solid materials notably with lower melting temperature (and preferably lower dielectric constant). That is, the solid materials used should be capable of being annealed at a temperature that does not unduly interfere or compromise existing integrated circuit structures.

$SiO_2$ has been widely used in microelectronics technology as an inter-layer dielectric, as trench isolation and as passivation between active silicon device regions and interconnects. In microelectronics technology, metal contacts, via and interconnects are fabricated after device processing in silicon, while device isolation regions are fabricated prior to device processing. The processing temperature for contacts and interconnects is required to be low enough not to significantly alter impurity profiles in silicon. Corresponding thermal budgets allowed must be below 1000° C. for time periods less than a minute, with appropriate compatibility with interconnect metallurgy. An example of such an $SiO_2$—based dielectric is the $\{K_2O-Al_2O_3-4SiO_2\}$ leucite—$SiO_2$ binary system.

Figure 13:
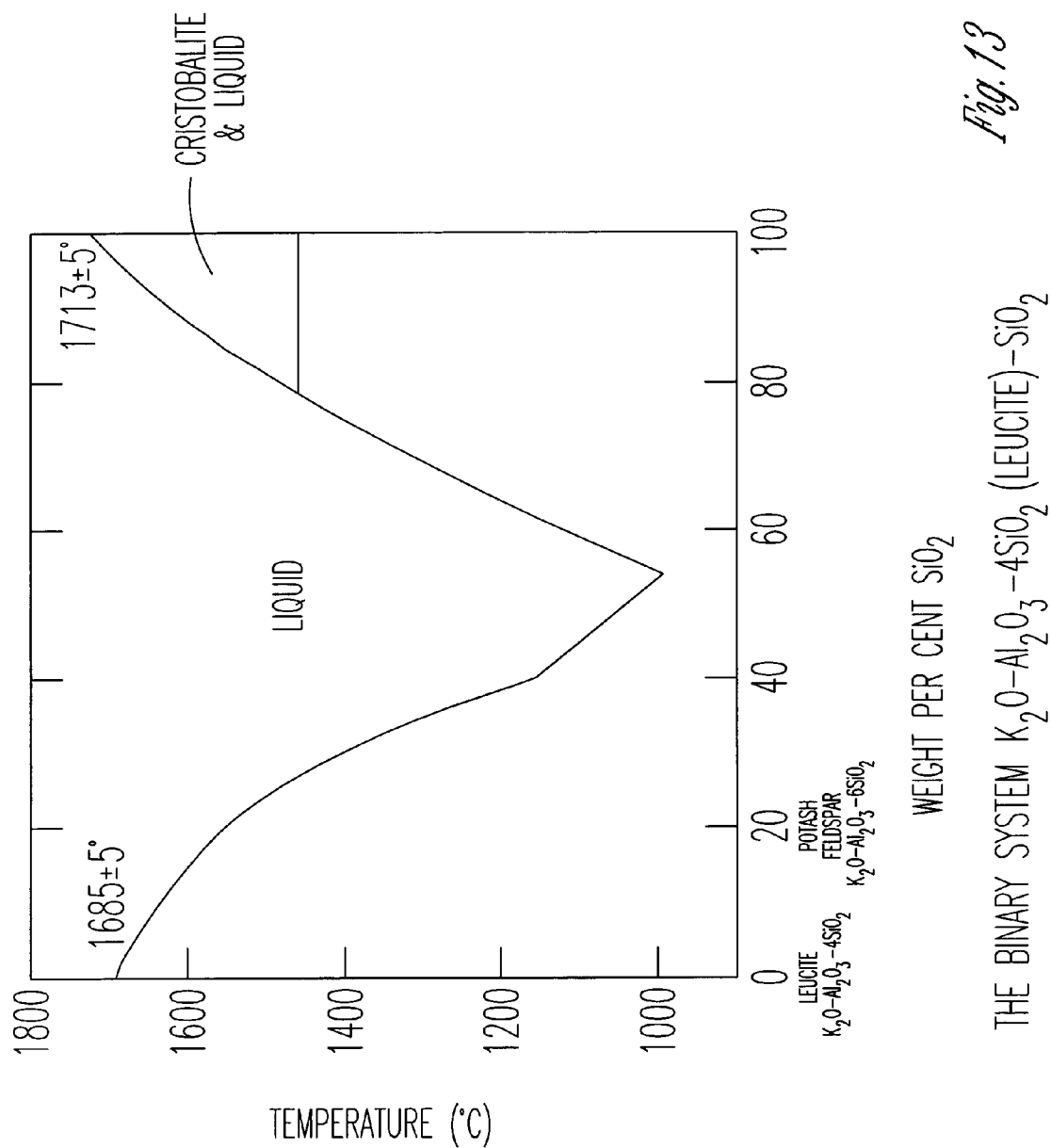
FIG. 13 illustrates the binary system $\{K_2O\text{---}Al_2O_3\text{-}4SiO_2\}$ leucite-$SiO_2$.

FIG. 13 illustrates the binary system $K_2O-Al_2O_3-4SiO_2$ (leucite)-$SiO_2$. FIG. 13 shows a phase diagram and associated low temperature eutectic at ~55% $SiO_2$ concentration. In one embodiment, such a dielectric is sputter-deposited with Tungsten metallurgy as studs and as first and second levels of interconnects. In one embodiment, the dielectric is applied earlier in the process for device isolation. In these applications, the electric deposition is followed by the creation of an appropriate array of cylindrical holes into the dielectric. These cylindrical holes are transformed to an empty space, such as empty spheres, pipes or plates through an annealing process.

One embodiment uses laser pulse annealing to an appropriate temperature close to the melting point of the dielectric, thus achieving a desired empty space filling factor (porosity) and low k value. In various embodiments, tungsten interconnect technology is employed by standard damascene or metal inlaid process.

Creating voids in an isolation regions reduces parasitic inter-diffusion capacitance and lateral noise propagation within silicon as well as parasitic line to substrate capacitance. Creating voids within the inter-layer dielectric reduces parasitic gate-to-diffusion, line-to-diffusion and substrate capacitance components as well as inter-level and intra-level line to line capacitance. Benefits in microelectronic chip design include: parasitic bitline capacitance reduction; sense-amp signal improvement in array designs, such as DRAM, SRAM, NVRAM and the like; improved random logic cell designs that result in improved density speed and power; and improved analog and digital design integration within the chip by reducing noise propagation.

Figure 14:
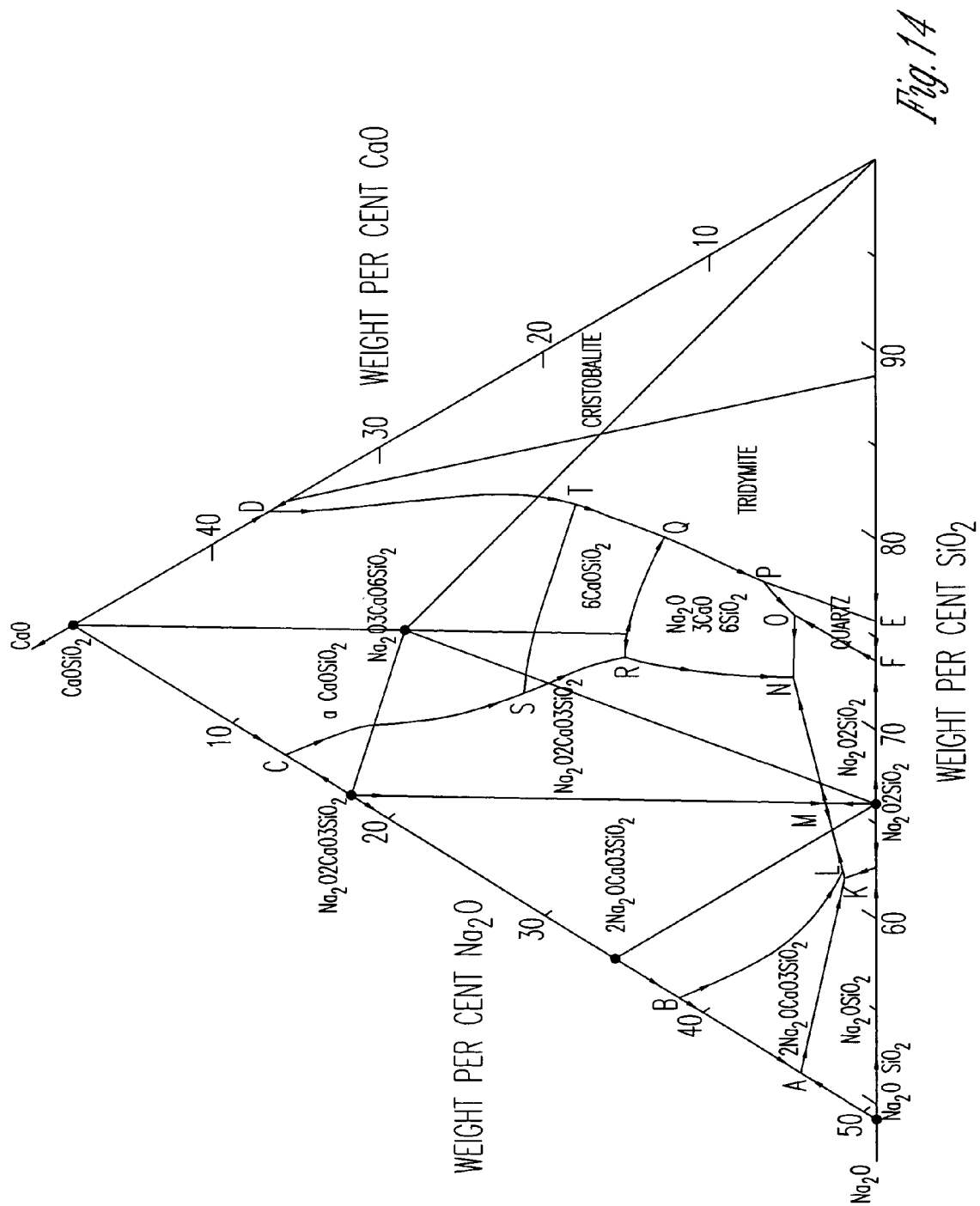
FIG. 14 illustrates a phase equilibrium diagram of the ternary system $Na_2\text{---}CaO\text{---}SiO_2$ showing boundary curves and tie-lines.
Figure 15:
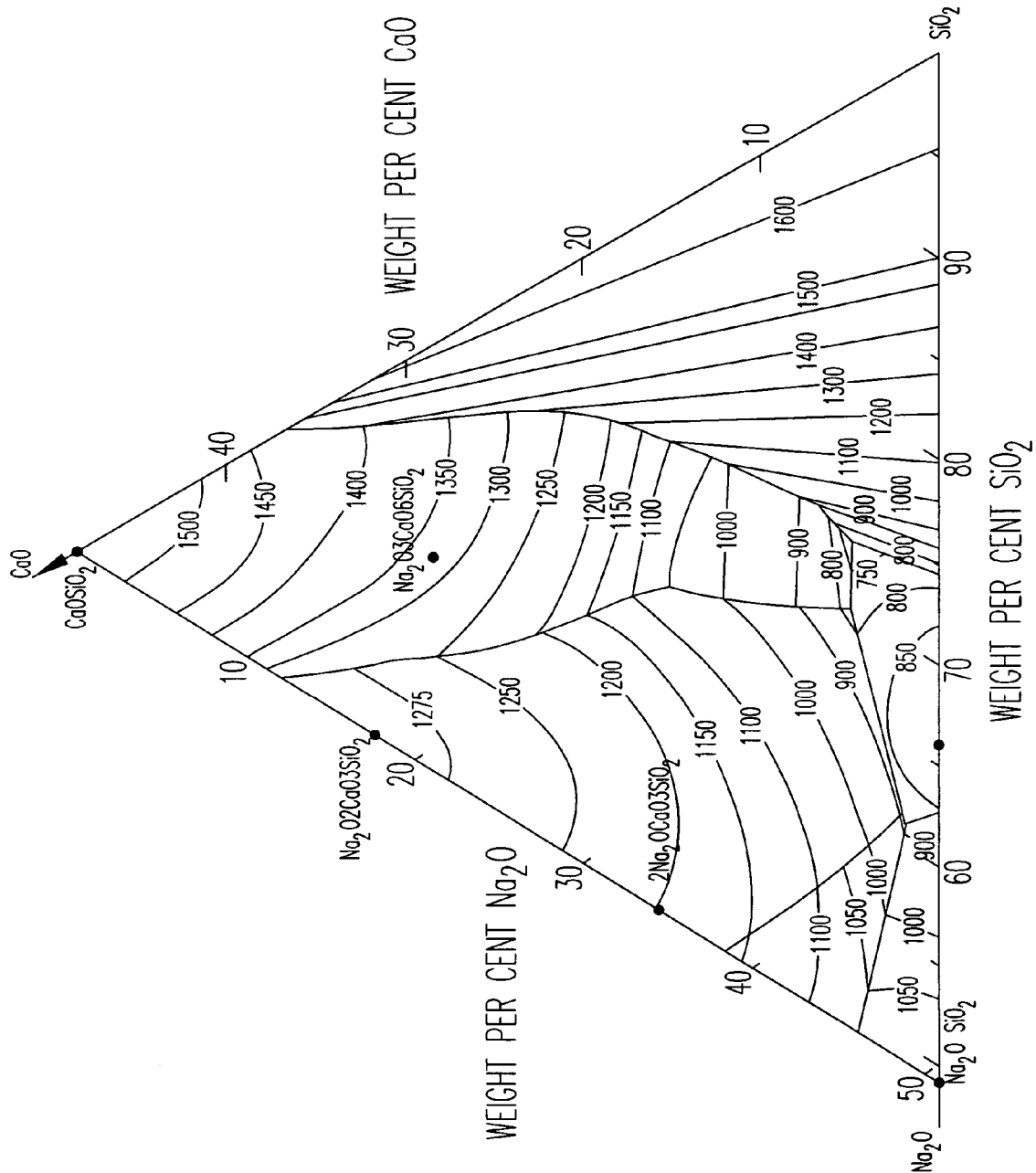
FIG. 15 illustrates a phase equilibrium diagram of ternary system $Na_2\text{---}CaO\text{---}SiO_2$ showing isotherms.

FIG. 14 illustrates a phase equilibrium diagram of the ternary system $Na_2$—$CaO$—$SiO_2$ showing boundary curves and tie-lines. FIG. 15 illustrates a phase equilibrium diagram of ternary system $Na_2$—$CaO$—$SiO_2$ showing isotherms. In one embodiment, the dielectric is a multi-component $Na_2O$—$CaO$—$SiO_2$ glass. In one embodiment, the dielectric is a ternary eutectic composition of the glass. The lowest-melting eutectic of soda ($Na_2O$) and silica ($SiO_2$) is at 793° C. and of soda, lime and silica is at 725° C. These are shown in the ternary diagrams of FIGS. 14 and 15. In choosing a glass composition several factors are considered. One factor is whether the glass forms a suitable insulator. Another factor is whether the composition is stable during the formation of the empty spaces. As such, it is desirable to use glass compositions which are thermodynamically invariant.

In one embodiment, the dielectric includes organic polymers such as polytetrafluoroethylene (Teflon®). Another method for producing porous polymers for integrated circuit applications is discussed by Farrar in U.S. Pat. No. 6,077,792 entitled "Method of Forming Foamed Polymeric Material for an Integrated Circuit." In one embodiment, the dielectric includes lead acetate with a melting point of 280° C. and a dielectric constant (k) of 2.6.

The figures presented and described in detail above are similarly useful in describing the method aspects of the present subject matter. The methods described below are nonexclusive as other methods may be understood from the specification and the figures described above. One aspect provides a method for forming a wide variety of insulators in semiconductor applications, such as interconnect dielectrics, and other applications that require or desire an insulator with a low dielectric constant.

Figure 16:
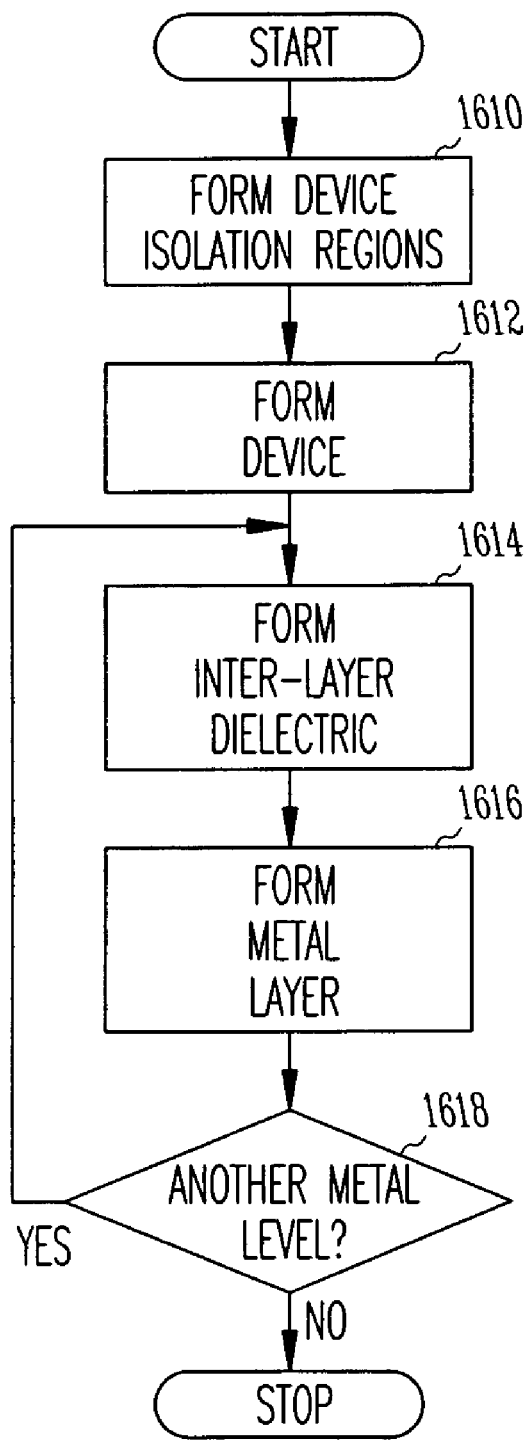
FIG. 16 illustrates one embodiment for forming a integrated circuit.

FIG. 16 illustrates one embodiment for forming a integrated circuit. According to this embodiment, device isolation regions are formed at 1610, and one or more devices are formed at 1612. An inter-layer dielectric over the devices is formed at 1614. At 1616, a metal level is formed over the inter-layer dielectric and is appropriately connected or coupled to the devices. One method for depositing a metal pattern is the dual damascene process. Other methods includes the single damascene or subtractive etch metal process. It is determined at 1618 whether another metal level is to be formed. If it is determined that another metal level is to be formed, then the process returns to 1614 to form another inter-layer dielectric and to form a metal level over the dielectric at 1616 with the appropriate connections to the devices. If it is determined at 1618 that another metal level is not to be formed, then the process terminates. This process can be forming another inter-layer dielectric and forming another metal level can be repeated as many times as necessary to produce the required number of metal levels. It is noted that the dielectric material is chosen that has an appropriate annealing temperature to perform the surface transformation process without damaging other parts of the integrated circuit. Different dielectric materials are capable of being used in different parts of the integrated circuit, as desired or required by the application.

Figure 17:
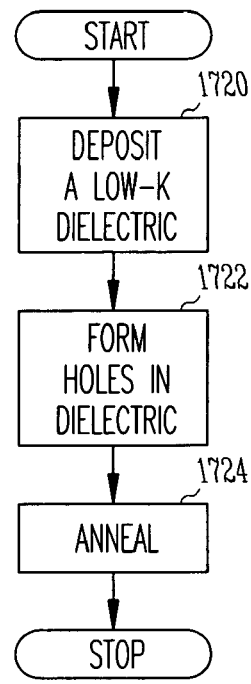
FIG. 17 illustrates one embodiment for forming a low-k insulator for device isolation regions and/or inter-layer dielectrics.

FIG. 17 illustrates one embodiment for forming a low-k insulator for device isolation regions and/or inter-layer dielectrics, shown previously at 1610 and 1614 in FIG. 16. According to one embodiment, a low-k dielectric is deposited at 1720. Holes are formed in the low-k dielectric at 1722. At 1724, the low-k dielectric material is annealed to cause surface transformation. The result of the surface transformation is that the holes that were previously formed in the low-k dielectric are transformed into empty spaces under the surface of the dielectric. These empty spaces lower the effective dielectric constant. Furthermore, the use of the surface transformation technique allows the spaces to be arranged in such a manner as to maximize the amount of void space in the dielectric to minimize the effective dielectric constant.

It is noted that the formation of the holes in the dielectric, as represented by element 1722, and/or the annealing of the dielectric, as represented by the element 1724, can be performed either before or after the metal level is formed on the low-k dielectric. For example, upon completion of the metal level, an appropriate resist layer is applied and imaged with a series of holes where the hole diameter is at least one half or less of the line to line spacing. Again, a goal is to pack as much air in the dielectric volume because increasing the filling factor (f) of air decreases the effective dielectric constant ($k_{eff}$) of the dielectric volume. In one embodiment of the present invention, the diameter of the voids within the dielectric volume ranges from 1 micron to 0.2 micron.

It is possible to define the pattern using direct write e-beam lithography, but this is an expensive and time consuming process. A dense pattern of holes is all that is required to reduce the dielectric constant and the associated capacitive loading effects. Various techniques are available to form the holes in the solid material. One technique is imprint lithography. It may be desired to imprint the mask twice with an random offset of the mask between the printings in order to achieve a high density of holes. Another technique is to form a stencil using a method described by Asoh et al. (H. Asoh et al., "Fabrication of Ideally Ordered Anodic Porous Alumina with 3 nm Hole Periodicity Using Sulfuric Acid", J. Vac. Technol., B 19(2), March/April 2001, pp. 569-572) by first producing a metal mask that can be used repeatedly.

Continuing with the example, once the insulator has been patterned and holes are etched, the surface is heated rapidly to a temperature near the melting point of the insulator and the surface transformation of cylindrical holes to buried empty spaces takes place. The heating is accomplished by using a pulsed incoherent light or laser source that is applied for a few microseconds to a few milliseconds, thereby only heating the uppermost layer of the wafer. The wafer is rapidly cooled after the heat source is extinguished by the large thermal mass of the wafer.

Figure 18:
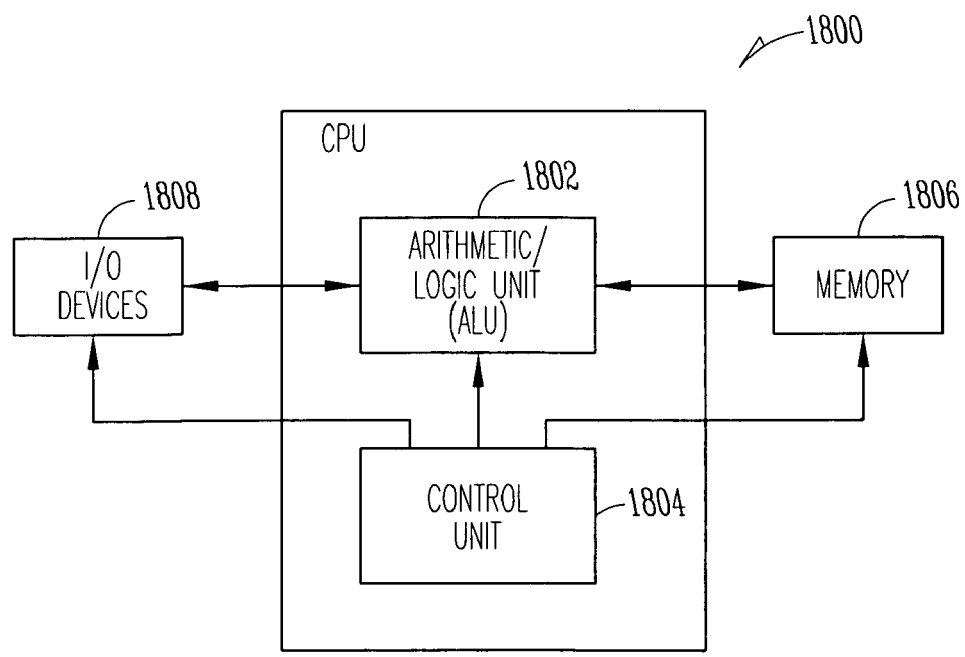
FIG. 18 is a simplified block diagram of a high-level organization of an electronic system according to the teachings of the present invention.

FIG. 18 is a simplified block diagram of a high-level organization of an electronic system according to the teachings of the present invention. The electronic system 1800 has functional elements, including a processor or arithmetic/logic unit (ALU) 1802, a control unit 1804, a memory device unit 1806 and an input/output (I/O) device 1808. Generally such an electronic system 1800 will have a native set of instructions that specify operations to be performed on data by the processor 1802 and other interactions between the processor 1802, the memory device unit 1806 and the I/O devices 1808. The control unit 1804 coordinates all operations of the processor 1802, the memory device 1806 and the I/O devices 1808 by continuously cycling through a set of operations that cause instructions to be fetched from the memory device 1806 and executed. The processor 1802 and memory device 1804, for example, are formed as integrated circuits with a low-k dielectric material according to the teachings of the present invention, thus lowering the RC time delay and improving the performance of the integrated circuits and the overall electronic system.

CONCLUSION

The present subject matter improves integrated circuit performance by reducing the RC time constant of interconnects. The present subject matter provides a low-k dielectric insulator of greater uniformity and dimensional stability for advanced integrated circuits. The low-k dielectric insulator of the present invention includes empty spaces controllably formed using surface transformation. Forming low dielectric constant materials by incorporating surface transformation formed empty spaces enables greater control of low-k dielectric properties while avoiding stress and cracking problems which are found in Xerogels and Aerogels.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An integrated circuit insulator structure, comprising:
  a solid structure of an insulator material, wherein the insulator material has a low annealing temperature and wherein the insulator material includes lead acetate; and
  a precisely-determined arrangement of at least one void formed within the solid structure,
  wherein the precisely-determined arrangement of at least one void within the solid structure lowers an effective dielectric constant of the insulator structure.

2. The integrated circuit insulator structure of claim 1, wherein the insulator material is a low-k insulator material.

3. The integrated circuit insulator structure of claim 1, wherein the precisely-determined arrangement of at least one void includes a plate-shaped void.

4. The integrated circuit insulator structure of claim 3, wherein the precisely-determined arrangement of at least one void includes a stack of a plate-shaped voids.

5. The integrated circuit insulator structure of claim 1, wherein the precisely-determined arrangement of at least one void includes at least one pipe-shaped void.

6. The integrated circuit insulator structure of claim 1, wherein the precisely-determined arrangement of at least one void includes at least one surface transformation formed empty space.

7. An integrated circuit insulator structure, comprising:
  a solid structure of an insulator material, wherein the insulator material has a low annealing temperature and wherein the insulator material includes lead acetate; and
  a precisely-determined arrangement of at least one sphere formed within the solid structure by surface transformation,
  wherein the precisely-determined arrangement of at least one sphere within the solid structure lowers an effective dielectric constant of the insulator structure.

8. The integrated circuit insulator structure of claim 7, wherein the precisely-determined arrangement of at least one sphere includes a close-packed structure of empty spheres.

9. The integrated circuit insulator structure of claim 7, wherein the at least one void has a diameter of approximately 1 micron.

10. The integrated circuit insulator structure of claim 7, wherein the at least one void has a diameter of approximately 0.2 micron.

11. An electronic system, comprising:
  a processor; and
  a memory coupled to said processor,
  wherein the processor and the memory are formed as at least one integrated circuit, including:
    a plurality of devices;
    at least one metal level operatively coupled to the plurality of devices; and
    an insulator structure between the plurality of device and the at least one metal level, the insulator structure including a solid structure of an insulator material, and a precisely determined arrangement of at least one void formed within the solid structure, wherein the insulator material has a low annealing temperature and wherein the insulator material includes lead acetate,
  wherein the precisely-determined arrangement of at least one void within the solid structure lowers an effective dielectric constant of the insulator structure and improves the performance of the processor and the memory.

12. The electronic system of claim 11, wherein the insulator material is a low-k insulator material.

13. The electronic system of claim 11, wherein the precisely-determined arrangement of at least one void includes a close-packed structure of empty spheres.

* * * * *